United States Patent [19]

Bahder et al.

[11] 4,112,354
[45] Sep. 5, 1978

[54] MOBILE BRIDGE TEST APPARATUS AND METHOD UTILIZING A SUB-POWER FREQUENCY TEST SIGNAL FOR CABLE SYSTEM EVALUATION

[75] Inventors: George Bahder, Edison; George S. Eager, Jr., Upper Montclair; Rafael Suarez, Avenel, all of N.J.

[73] Assignee: General Cable Corporation, Greenwich, Conn.

[21] Appl. No.: 739,847

[22] Filed: Nov. 9, 1976

[51] Int. Cl.² .................. G01R 31/12; G01R 27/00
[52] U.S. Cl. ............................................. 324/54
[58] Field of Search ........................................ 324/54

[56] References Cited
U.S. PATENT DOCUMENTS

| | | | |
|---|---|---|---|
| 1,253,211 | 1/1918 | Chubb | 324/54 |
| 1,943,392 | 1/1934 | Paine et al. | 324/54 |
| 2,130,865 | 9/1938 | Watts et al. | 324/54 |
| 3,189,818 | 6/1965 | Frakes | 324/54 |

FOREIGN PATENT DOCUMENTS

| | | | |
|---|---|---|---|
| 577,880 | 6/1933 | Fed. Rep. of Germany | 324/54 |
| 850,163 | 9/1952 | Fed. Rep. of Germany | 324/54 |

*Primary Examiner*—Gerard R. Strecker
*Attorney, Agent, or Firm*—Roy C. Hopgood; John M. Calimafde; Charles W. Neill

[57] ABSTRACT

This apparatus is for evaluation installed cable systems, including those that are already in use. The apparatus measures dissipation factor, partial discharge (corona) and insulation resistance of the cable system; all of these being necessary to determine the condition of the cables. This invention is unique, in that it can be used with installed cable systems that have their metallic shielding grounded; and the apparatus can be mounted on a truck or trailer for movement to any place where an installed system is to be evaluated.

9 Claims, 6 Drawing Figures

MOBILE BRIDGE TEST APPARATUS AND METHOD UTILIZING A SUB-POWER FREQUENCY TEST SIGNAL FOR CABLE SYSTEM EVALUATION

BACKGROUND AND SUMMARY OF THE INVENTION

Extruded dielectric high-voltage power cables may fail prematurely in service for a number of different reasons. These reasons include mechanical damage to the cable in shipment, storage or handling in the field and during installation. Another reason is conductor and/or insulation semiconducting shields that exhibit excessive electrical resistivity, particularly after load cycling of the cable in service and excessive corrosion of uncovered outer concentric neutral wires.

Other failures result from significant imperfections in the insulation structure of the cable in the form of skips and projections at the conductor shield, voids and contaminants in the insulation and irregularities and poor adhesion at the insulation shield interface with the insulation which may not be detectable at the factory by present industry tests. Still another cause of failure is the development and propagation of electrochemical trees, resulting from moisture ingress into the insulation and the presence of imperfections and high electrical stress in the region of the imperfections.

Installed high-voltage, extruded dielectric, power cable systems have been tested in the past by imposing a high-voltage direct current on the system. Such tests detected some of the imperfections; but were ineffective in detecting other causes of premature cable system failures, AC high-voltage acceptance and maintenance tests have not been practiced to any significant extent because of the heavy weight and bulk of the equipment required due principally to the relatively high capacitive current drawn by the cable at the voltage required to yield meaningful results. Conventional dissipation factor bridges used for factory tests require that the cable insulation shield be electrically insulated from ground, whereas installed cables normally have the shields permanently grounded. Partial discharge tests (corona) on long lengths of cable, with conventional equipment, require a corona-free 60 Hz high-voltage power supply with large kVA capacity. Such units are too heavy to conveniently transport to field test locations. Furthermore, if the normal 60 Hz power is used in the field to energize the standard partial charge detectors, there is the extremely difficult task of filtering out the intense parasitic interferences present in these power lines.

With this invention, the partial discharge and dissipation factor bridges are modified to operate with cable systems having the outer shield of the cable grounded, as is the case with cable systems installed in the field.

This invention preferably includes the additional characteristic of including a power supply which operates at a frequency of 0.1 Hz. At this frequency, the kVA capacity needed to charge long lengths of cable for partial discharge tests is only 1/600th of the conventional 60 Hz supply. This makes the size and weight of such power supply small enough to be portable for transportation to field installations.

Other features and advantages of the invention will appear or be pointed out as the description proceeds.

BRIEF DESCRIPTION OF DRAWING

In the drawing, forming a part hereof, in which like reference characters indicate corresponding parts in all the views.

DESCRIPTION OF PREFERRED EMBODIMENT

Figure 1:
FIG. 1 is a diagrammatic view showing the apparatus for making cable system evaluations, the equipment being small and light enough for transportation on a wheeled vehicle, shown in FIG. 1 as a pick-up truck.

FIG. 1 shows the test apparatus of this invention including a low-frequency generator 10 and detector bridges and auxiliary equipment 12 mounted in a wheeled vehicle such as a van truck 14 shown in FIG. 1. A trailer can be used if desired.

Figure 2:
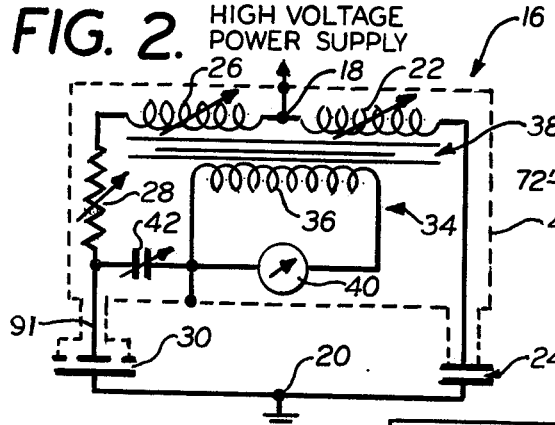
FIG. 2 is a diagrammatic showing of an inverted transformer ratio type power factor bridge used for this invention.

FIG. 2 shows an inverted transformer ratio type dissipation factor bridge assembly 16, which is part of the present invention. At a top end 18 of the bridge, the adjustable components 22, 26 are connected with a high-voltage power supply. The fixed components consist of the standard capacitor 30 and cable under test 24, and the bottom ends 20 of the bridge are grounded. The adjustable arms of the bridge unit 16 includes variable reactances 22 and 26 magnetically coupled to amplifier-null indicator meter 40 and connected to the bridge fixed components, the cable 24 that is to be tested or evaluated and the standard capacitor 30.

The arm of the bridge unit 16 that has variable reactant 26 is connected in series with a variable resistance 28 and in series with the standard capacitor 30. Variable capacitor 42 connects from the connection between the variable resistance 28 and the standard capacitor 30 to a bridge guard shield 44.

A detector 34 for indicating differences in the amount of current flowing in the opposite sides of the bridge includes a secondary coil 36, which is part of a transformer 38 of which the variable reactances 22 and 26 are primary coils, and their function is to determine the unknown capacitance of the cable under test 24 when balanced against the standard capacitor 30 for minimum deflection of the meter 40. The amplifier-meter 40 is connected across the coil 36 to indicate current flow, if any. A variable capacitor 42 connected from the bridge arm of the standard capacitor 30 to the bridge guard shield 44 and variable resistance 28 connected in series with the standard capacitor 30 through bridge lead connection 91, are used to balance the phase angle differential between the cable under test 24 and the standard capacitor 30 to determine the dissipation factor of the cable 24 which is equal to the tangent of the angle.

Figure 3:
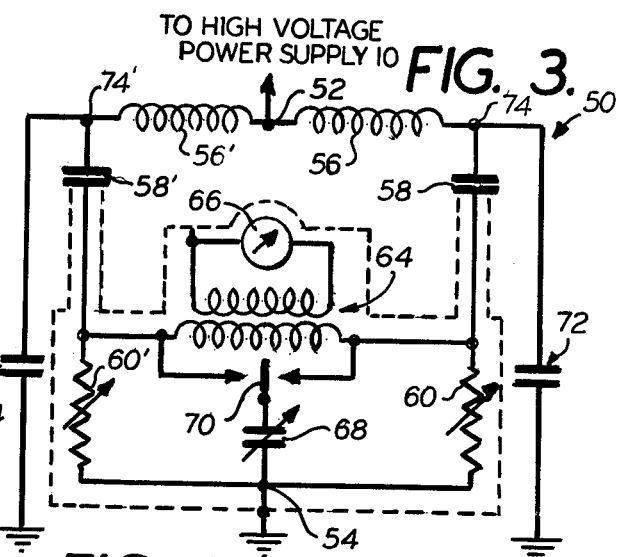
FIG. 3 is a special partial discharge bridge detector used with this invention.

FIG. 3 is a diagrammatic showing of a special partial discharge bridge detector unit 50 for this present invention. The basic factors to consider in the design of equipment to detect partial discharges in cables are as follows:

(1) The cable is a transmission line with distributed components; consequently, it will attenuate the voltage magnitude of the high-frequency pulses generated by partial discharges as they travel along the cable to the detecting end. Therefore, the detection cannot be proportional to voltage magnitude, as in the case when testing lump components; no accurate equipment calibration will be possible. Instead, the detector must give an indication proportional to the energy generated by the discharge because this arrives at the detecting end of the cable with insignificant loss, although its wave shape changes as it travels along the cable length.

(2) The detector must be capable of integrating very small bits of energy to produce a resultant signal strong enough for detection. This is necessary because extruded insulation, if processed improperly, may contain detrimental small distributed voids or porosity. The energy produced in such small cavities is not enough to be detected individually, but can be detected as the result of the sum of many small bits.

(3) The detector must be capable of rejecting outside signals which interfere with accurate detection of the discharges generated in the cable under test.

The upper end of the bridge unit 50 has a connection 52 with a high-voltage power supply and preferably with the low-frequency generator 10 shown in FIG. 1. The reason for using the low-frequency will be explained later. The end of the bridge unit 50 opposite the connection 52 is a ground connection 54.

The right-hand side of the bridge unit 50 includes an induction coil 56, a fixed capacitive component 58, and a variable resistance 60, all connected in series. The left-hand side of the bridge unit 50 includes corresponding components indicated by the same reference characters with a prime appended. The fixed components in the two sides of the bridge unit 50 are preferably equal, and the resistance units 60 and 60' are preferably equal except to the extent that they may be differently adjusted.

An isolation transformer 64 is connected between opposite sides of the bridge unit 50 at locations between the capacitive components and the variable resistances of the respective sides of the bridge unit. An amplifier-meter 66 is inductively connected to the circuit through the isolation transformer 64 for indicating differences in voltage on opposite sides of the bridge for balancing and to indicate the presence and magnitude of partial discharges in the cable being tested when stressed with the test voltage. The partial discharge indications are registered in a calibrated scale and also displayed in the calibrated screen of a storage type oscilloscope which retains the images of the displayed signals until they are erased manually or automatically.

A variable capacitive unit 68 is connected with the lower end of the bridge unit 50 and can be connected with either side of the bridge selectively by a switch 70. This variable capacitive element 68 and the switch 70 comprise a phase balance for the circuit shown in FIG. 3.

Two test specimens—that is, lengths of the cable system which are equal—are designated by the reference characters 72 and 72' in FIG. 3. These test specimens are connected with the bridge unit 50 at connections 74 and 74'; and the specimens are grounded by their own connections.

For the partial discharge test on installed cables, this invention uses the power supply 10 (FIG. 1) which operates at a frequency of 0.1 Hz. At this frequency, the kVA capacity needed to charge long lengths of cable is 1/600th that of the conventional 60 Hz supply. This makes the size and weight of such power supply small enough to be portable for transportation to field installations. In addition, using a power supply which is independent of the 60 Hz power lines, a significant reduction of the test interferences originating in these lines is obtained.

This invention can be used with a balanced method for the detection of partial discharges, and such a method offers several advantages where pairs of identical cables 72 and 72' (FIG. 3) are available. Conventional bridge type detectors require that the cable shields be insulated from ground. For this invention, in order to use the balanced method on cables with grounded shields, the special circuit of FIG. 3 was developed. With balance detection, the magnitude of the interferences originating in the high voltage power supply and/or common mode noise in the cable under test can be reduced considerably, but requires that two cables identical in length and geometry be connected in the bridge circuit and tested simultaneously. This is possible in the numerous 3 phase installations where the cables run together and have the same length.

The special detector can easily be converted to operate as a single-ended straight detector to test single lengths, when 2 identical tables are not available. For this mode of operation, it is necessary that the high voltage supply be free of partial discharges (corona).

The resolution of the detected high-frequency pulses, generated by partial discharges, as displayed in a storage oscilloscope indicator, is far better with the 0.1 Hz detector than with 60 Hz detectors.

Figure 5:
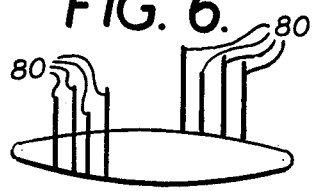
FIGS. 5 and 6 are illustrations showing the difference in the signals obtained when using 60 Hz and 0.1 Hz, respectively, on discharge display devices.
Figure 6:
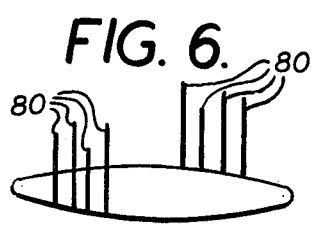

At the 0.1 Hz frequency, discharges 80 (FIG. 6) generated at individual ½ cycles can be clearly observed in the storage oscilloscope ellipse display. On the 60 Hz test, the speed of polarity reversal is such that the visual display is a conglomerate of pulses 82 (FIG. 5) bunched together at locations between 45° to 90° for the positive half of the test cycle, and between 225° to 270° for the negative half.

The 0.1 Hz generator 10 (FIG. 1) for use with the partial discharge detector (FIG. 3) consists of four components and their interconnections: (1) control console, (2) modulator/voltage control, (3) high voltage transformer, (4) demodulator unit. This is commercial equipment, and itself is not novel.

By way of example, but not of limitation, the discharge detector shown in FIG. 3 can be operated at frequencies of 0.1 Hz or 60 Hz in a balanced or single-ended mode. The high-voltage section consists of two inductors, 56 and 56', one for each side of the bridge unit 50 and connected in series with the high-voltage supply connection 52 and the cables under test. They are designed with low shunt capacitance. Their function is to isolate the cables under test from each other for the high-frequency interferences originating in the high-voltage power supply, and present a high impedance path to high-frequency signals from partial discharges generated in the cables under test, thus increasing detecting sensitivity, as more energy flows through the discharge detector path.

Two discharge-free capacitors 58 and 58', one per bridge arm, are connected in series with the low voltage arms of the bridge to reduce the magnitude of the test voltage to a level low enough for safe operation of the low-voltage components of the bridge, used for balancing and detecting. These capacitors 58 and 58' act as low impedance paths to the high frequency signals, generated in the cables by partial discharges, to facilitate detection.

The low-voltage portion of the bridge circuit is composed of the two adjustable resistive arms 60 and 60', as shown in FIG. 3. The left arm 60' value is selected for the best bridge response, and the right arm 60 value is balanced against the selected 60' value to give the best possible rejection of common mode signals. The capacitive element 68 can be added in parallel to either side, 60' or 60, to balance out the phase differential between the two sides of the bridge. For best common mode rejection, the cables under test should be the same length. Part of the interfering signals entering through the high-voltage supply will travel the cables' length and will be reflected at the unterminated ends. If the traveling time, the velocity of propagation or attenuation of the cables is different, complete interference cancellation will not be obtained and the signals will be displayed.

The discharge amplifier detects and amplifies unbalanced high-frequency signals generated in the cables by partial discharges. It has a selected band pass response for reduction of interfering signals which occur outside these spectra.

The amplified high-frequency discharge signal is introduced in a display control unit which stretches out the signal for display in a storage oscilloscope. This unit also contains circuitry to generate an elliptical sweep in the oscilloscope at 0.1 Hz, to display the detected signals. The magnitude of the detected discharges is also indicated in a discharge meter. For detector calibration and for aid in bridge balancing, the control section has built-in circuitry to generate calibrating signals at steps of 1, 10, 100 and 1000 picocoulombs.

Figure 4:
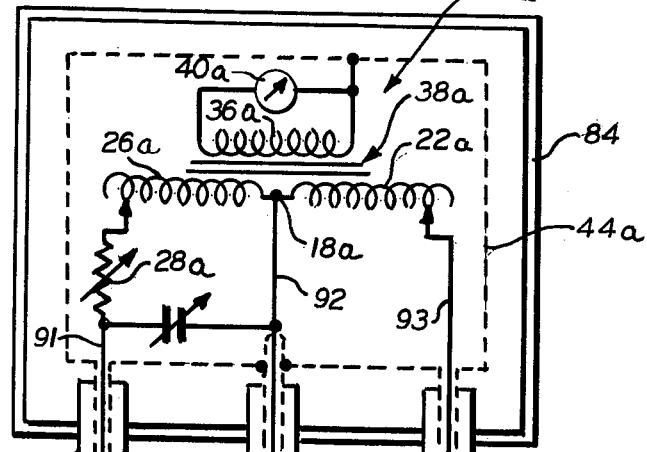
FIG. 4 shows an inverted dissipation power factor bridge enclosed in a console and equipped with the shielded leads for testing cable systems in accordance with this invention.

FIG. 4 shows an inverted dissipation power factor unit 16a, similar to the bridge unit 16 shown in FIG. 2 but in somewhat more detail. Parts in FIG. 4 corresponding with those in FIG. 2 are designated by the same reference character, but with a letter "a" appended. FIG. 4 shows the bridge 16a mounted inside a shielded guard metallic housing 44a enclosed in a console 84, which provides protection against the high voltage used in the bridge circuits.

The bridge unit 16a is equipped with high-voltage tri-axial connecting leads 86, 87 and 88, as shown in FIG. 4. Each connecting lead 86, 87 and 88 has an outer insulation shield 90 which is at ground potential and insulated from the full test voltage of the middle conductors 91, 92 and 93. The insulation metallic shields 90 which are insulated from the guarded components 44a of the system and the middle conductors 91, 92 and 93 connect the bridge to the measuring electrode of a standard capacitor 30a, the high voltage power supply and the conductor 24a of the cable 95 to be tested respectively.

The standard capacitor 30a, which is external to the inverted bridge console 84, provides a zero power factor reference by employing pressurized gas as the dielectric and a suitable guard shell. It is mounted on an insulating stand 96 for operating in an inverted way where the measuring electrode and the guard shell operate at full test voltage.

The preferred embodiments of the invention have been illustrated and described, but changes and modifications can be made and some features can be used in different combinations without departing from the invention as defined in the claims.

What is claimed is:

1. Mobile field-test apparatus for the partial-discharge testing of a given length of an installed shielded high-voltage multiple-cable system when the cable conductors of the given length of the system have been disconnected from the system at predetermined spaced points, the shields being left in installed grounded condition, said apparatus comprising a bridge having two sides and interconnected at their opposite ends, one of said ends including a high-voltage connection and the other of said ends including a low-voltage balancing network having a ground connection, corresponding inductive and capacitative reactance elements similarly and series-interconnected in each side of said bridge, the inductive elements being connected to said high-voltage connection and the low-voltage ends of the capacitative reactance elements being connected to corresponding parts of said balancing network, first means for connecting one conductor of a disconnected high-voltage cable-system length under test to the interconnection of the reactance elements of one side of said bridge, second means for connecting a second conductor of the disconnected cable system to the interconnection of the reactance elements of the other side of said bridge, said balancing network including a transformer having a primary connecting the low-voltage sides of the respective capacitative reactance elements, meter means connected across the secondary of said transformer, and a high-voltage power source connected to the respective ends of said bridge, said power source being characterized by an output voltage which varies between zero and high voltage at a rate which is very substantially more slow than the cyclic rate of high-voltage power distribution for which the cable system is installed.

2. Mobile apparatus according to claim 1, in which said balancing network includes separate corresponding impedance elements each of which connects a different end of said primary to ground, and an a-c path to ground via a selected end of said primary, whereby said meter means provides a response indicative of the partial-discharge condition of each of said cables according to the selected operation of said switch.

3. Mobile apparatus according to claim 1, in which said power source is characterized by a low-frequency output which is at least an order of magnitude less than the cyclic rate of high-voltage power distribution for which the cable system is installed.

4. Mobile apparatus according to claim 1, in which said power source is characterized by a low-frequency output which is at least two orders of magnitude less than the cyclic rate of high-voltage power distribution for which the cable system is installed.

5. Mobile apparatus according to claim 1, in which said power source is characterized by a low-frequency output in the order of 0.1 Hz.

6. Mobile apparatus according to claim 1, in which said balancing network includes separate and corresponding resistance elements each of which is grounded at one end, each of the other ends of said resistance elements being connected to the low-voltage end of a different one of said capacitative reactance elements, and selectively operable means for connecting a grounded capacitance to one or the other of the ends of said primary.

7. Mobile apparatus according to claim 1, in which said balancing network is surrounded by a grounded shield.

8. The method of using a mobile field-test bridge circuit to evaluate the partial-discharge condition of a given length of an installed cable system having multiple cables each of which has a high-voltage conductor and a permanently grounded shield, said bridge circuit comprising two sides between a high-voltage end connection and a grounded low-voltage end, each side having at least two series-connected corrresponding reactance elements, which method comprises disconnecting the conductors of the given length from normal service at both ends, connecting one of the disconnected conductor ends to the interconnection of reactance elements on one side of the bridge, connecting another of the disconnected conductor ends to the interconnection of reactance elements on the other side of the bridge, applying a varying voltage across the bridge ends of maximum amplitude at least as high as the voltage with which the system is intended to be used, said varying voltage varying between zero and said maximum amplitude at a rate which is very substantially more slow than the cyclic rate of high-voltage power distribution for which the cable system is installed, and observing the thusconnected portions of the cable system for partial discharge of said varying voltage.

9. Mobile field-test apparatus for the partial-discharge testing of a given length of an installed shielded high-voltage multiple- cable system when the cable conductors of the given length of the system have been disconnected from the system at predetermined spaced points, the shields being left in installed grounded condition, said apparatus comprising a bridge having two sides and interconnected at their opposite ends, one of said ends including a high-voltage connection and the other of said ends including a low-voltage connection to ground, each side comprising two corresponding series-connected reactance elements between one of said low-voltage connections and said high-voltage connection, first means for connecting one conductor of a disconnected high-voltage cable-system length under test to the interconnection of the reactance elements of one side of said bridge, second means for connecting a second conductor of the disconnected cable system to the interconnection of the reactance elements of the other side of said bridge, meter means transformer-coupled between and having its primary winding interconnecting said low-voltage connections, selectively operable means for completing a bridge connection to ground via a selected one or the other of the ends of said primary winding, and a high voltage power source connected to the respective ends of said bridge, said power source being characterized by an output voltage which varies between zero and high voltage at a rate which is very substantially more slow than the cyclic rate of high-voltage power distribution for which the cable system is installed.

* * * * *